(12) United States Patent
Goto

(10) Patent No.: US 6,392,411 B1
(45) Date of Patent: May 21, 2002

(54) MR IMAGING METHOD, PHASE SHIFT MEASURING METHOD AND MR IMAGING SYSTEM

(75) Inventor: Takao Goto, Tokyo (JP)

(73) Assignee: GE Yokogawa Medical Systems, Limited, Tokyo (JP)

( * ) Notice: Subject to any disclaimer, the term of this patent is extended or adjusted under 35 U.S.C. 154(b) by 0 days.

(21) Appl. No.: 09/477,014

(22) Filed: Jan. 3, 2000

(51) Int. Cl.⁷ .................................................. G01V 3/00
(52) U.S. Cl. ........................................ 324/309; 324/307
(58) Field of Search ................................. 324/309, 307, 324/306, 308, 312, 314

(56) References Cited

U.S. PATENT DOCUMENTS

| 4,484,138 A | 11/1984 | Bottombly |
| 4,893,081 A | 1/1990 | Yuval |
| 5,570,019 A | * 10/1996 | Moonen et al. ............. 324/307 |
| 5,729,139 A | * 3/1998 | Goto .......................... 324/309 |

FOREIGN PATENT DOCUMENTS

| EP | 0818689 | 1/1998 |

* cited by examiner

*Primary Examiner*—Louis Arana
(74) *Attorney, Agent, or Firm*—Moonray Kojima

(57) ABSTRACT

The present invention aims to prevent the influence of a variation in residual magnetization due to a change in gradient or gradient magnetic field pulse. In an FSE sequence, reset pulses gys1j and gysrj each having amplitude equal to the maximum amplitude used in a phase axis are inserted into the phase axis before and behind an inversion pulse Pj.

8 Claims, 9 Drawing Sheets

Reset Pulse-based Phase-error Detecting Pre-Scan Sequence
P S Qoff

Reset Pulse-based Phase-error Detecting Pre-Scan Sequence
P S Qon

MR IMAGING METHOD, PHASE SHIFT MEASURING METHOD AND MR IMAGING SYSTEM

BACKGROUND OF THE INVENTION

1. Field of the Invention

The present invention relates to an MR imaging method, a phase shift measuring method and an MR (Magnetic Resonance) imaging system. More specifically, the present invention is concerned with an MR imaging method using a pulse sequence, which is capable of preventing the influence of variations in residual magnetization due to a change in gradient or gradient magnetic field pulse, a phase shift measuring method for measuring phase shifts in subsequent echoes due to the influence of eddy currents and residual magnetization caused by each preceding phase encoding pulse or the like in the pulse sequence, and an MR imaging system for executing these methods.

2. Description of the Related Art

The following prior arts have been disclosed in Japanese Patent Application Laid-Open No. Hei 10-75940.

(1) A phase shift measuring method for executing a pre-scan sequence for transmitting an excitation pulse, transmitting an inversion pulse, applying a phase encoding pulse to a phase axis, applying a read pulse to a read axis, applying a rewind pulse to the phase axis, continuously transmitting an inversion pulse, from echoes while a read pulse is being applied to the phase axis, and measuring a phase shift in each subsequent echo due to the influence of eddy currents and residual magnetization caused by each phase encoding pulse or the like, based on phase data obtained by converting the collected data into one-dimensional Fourier form.

(2) An MR imaging method wherein in a pulse sequence using a high-speed spin echo process for transmitting an inversion pulse after the transmission of an excitation pulse, applying a phase encoding pulse to a phase axis, collecting data from echoes while a read pulse is being applied to a read axis, repeating the application of a rewind pulse to the phase axis plural times while changing the phase encoding pulse, and collecting data of a plurality of echoes by one excitation, a compensating pulse for compensating for the amount of the phase shift measured by the phase shift measuring method described in the paragraph (1) is built or integrated into a phase encoding pulse, added to one or both immediately before or after the phase encoding pulse, built in a rewind pulse or added to one or both immediately before or after the rewind pulse.

The prior arts have been based on the precondition that the amount of the phase shift measured by the phase shift measuring method described in the paragraph (1) and the amount of the phase shift produced when no compensating pulse is provided in the pulse sequence of the high-speed spin echo process described in the paragraph (2), are equal to each other.

In a permanent magnet type MR imaging system, however, the two are not necessarily made equal to each other due to a magnetic hysteresis characteristic of a magnetic shunt plate or the like. Thus, the precondition employed in the prior arts is not established. This will be explained with reference to FIGS. 1 through 3.

FIG. 1 is a pulse sequence diagram showing the conventional high-speed spin echo process.

In this FSE (Fast Spin Echo) sequence SQ, an excitation pulse R and a slice gradient or gradient ss are first applied. Next, a first inversion pulse P1 and a slice gradient ss are applied. Then a phase encoding pulse gy1i is applied to a phase axis. Next, an NMR signal is received from a first echo echo1 while a leas pulse gxw is being applied. Thereafter, a rewind pulse gy1ri equal in time integrated value and opposite in polarity to the phase encoding pulse gy1i is applied to the phase axis. Incidentally, i indicates repetitive numbers. i=1 through I (e.g., I=128).

Next, a second inversion pulse P2 and a slice gradient ss are applied, a phase encoding pulse gy2i is applied to the phase axis, and an NMR signal is received from a second echo echo2 while the read pulse gxw is being applied. Afterwards, a rewind pulse gy2r equal in time integrated value and opposite in polarity to the phase encoding pulse gy2i is applied to the phase axis.

A jth inversion pulse Pj and a slice gradient ss are applied subsequently in the same manner as described above. A phase encoding pulse gyji is applied to the phase axis. An NMR signal is received from a jth echo echoj while the read pulse gxw is being applied. Thereafter, the application of a rewind pulse gyjri identical in time integrated value and opposite in polarity to the phase encoding pulse gyji to the phase axis is repeated for j=3 to J (e.g., J=8).

Assuming that the residual magnetization prior to the application of a phase encoding pulse gy11 (i=1) is defined as m1, the residual magnetization traces histories a1 and a2 so as to reach m1 again by the application of the phase encoding pulse gy11, as shown in FIG. 2 due to the magnetic hysteresis characteristic of the magnetic shunt plate or the like in the permanent magnet type MR imaging system. Further, the residual magnetization traces histories a3 and a4 so as to reach m2 by the application of a rewind pulse gy1rl.

Since the residual magnetization preceding the application of a phase encoding pulse gy21 becomes m2, the residual magnetization traces histories a5 and a6 so as to reach m3 by the application of the phase encoding pulse gy21, as shown in FIG. 3. Further, the residual magnetization traces histories a7 and a8 so as to reach m2 again by the application of a rewind pulse gy2rl.

In the permanent magnet type MR imaging system as described above, the residual magnetization varies depending on the histories in which the gradient magnetic field pulses such as the phase encoding pulse and the rewind pulse are varied, due to the magnetic hysteresis characteristic of the magnetic shunt plate or the like.

However, since the pre-scan sequence takes such a form as obtained by cutting down ones up to the collection of the first echo in the FSE sequence, the gradient magnetic field pulses coincide in application history with each other and the residual magnetization makes consistence, with respect to the first echo. Therefore, the aforementioned precondition is established. However, since the gradient magnetic field pulses do not coincide in application history with each other in the second echo or later, the residual magnetization does not make consistence and hence the aforementioned precondition is no longer established.

Therefore, a problem arises in that in the second echo or later, a phase shift in subsequent echo due to the influence of the residual magnetization caused by each gradient magnetic field pulse cannot be sufficiently corrected.

Since a linear relationship is established between the area of each gradient magnetic field pulse and a generated phase error, the above-described problem is considered to be free from occurring in eddy currents.

SUMMARY OF THE INVENTION

A first object of the present invention is to provide an MR imaging method capable of preventing the influence of a variation in residual magnetization due to a change in gradient magnetic field pulse.

A second object of the present invention is to provide a phase shift measuring method capable of causing a phase shift in subsequent echo due to the influence of eddy currents and residual magnetization caused by a preceding phase encoding pulse or the like in an FSE pulse sequence to coincide with an actual FSE sequence to thereby measure the phase shift.

Further, a third object of the present invention is to provide an MR imaging system for executing the above-described methods.

In a first aspect, the present invention provides an MR imaging method using a high-speed spin echo process comprising the steps of transmitting an inversion pulse after the transmission of an excitation pulse, applying a phase encoding pulse to a phase axis, collecting data from echoes while applying a read pulse to a read axis, repeating the application of a rewind pulse to the phase axis plural times while changing the phase encoding pulse, collecting data from a plurality of echoes by one excitation, and inserting a positive or negative reset pulse having amplitude equal to the maximum amplitude used in an arbitrary gradient axis or having greater amplitude into the arbitrary gradient axis before and behind the inversion pulse.

In the MR imaging method according to the first aspect, since the amplitude of the reset pulse is not smaller than that of each of other gradient magnetic field pulses, the residual magnetization produced after the application of the reset pulse is always kept constant regardless of the applied histories of other gradient magnetic field pulses. Further, since the reset pulse is inserted after the inversion pulse, i.e., immediately before the application of the phase encoding pulse, the residual magnetization produced before the application of the phase encoding pulse is always kept constant. It is thus possible to prevent the influence of a variation in residual magnetization due to a change in gradient magnetic field pulse.

Incidentally, the reset pulse does not influence phase encoding because it is also inserted before the inversion pulse.

In a second aspect, the present invention provides a phase shift measuring method comprising the steps of transmitting an excitation pulse, transmitting an inversion pulse, applying a phase encoding pulse to a phase axis, applying a read pulse to a read axis, applying a rewind pulse to the phase axis, continuously transmitting an inversion pulse, applying a dephaser pulse to the phase axis, collecting data from echoes while applying a read pulse to the phase axis, determining the amount of a phase shift due to the influence of the phase encoding pulse, based on phase data obtained by converting the data into one-dimensional Fourier form, and inserting a positive or negative reset pulse having amplitude equal to the maximum amplitude used in a phase axis or having greater amplitude into the phase axis before and behind the inversion pulse.

In the phase shift measuring method according to the second aspect, since the amplitude of the reset pulse is not smaller than that of each of other gradient magnetic field pulses, the residual magnetization produced after the application of the reset pulse is always kept constant regardless of the applied histories of other gradient magnetic field pulses. Further, since the reset pulse is inserted after the inversion pulse, i.e., immediately before the application of the phase encoding pulse, the residual magnetization produced before the application of the phase encoding pulse is always kept constant. Namely, the residual magnetization can be made coincident with the residual magnetization prior to the application of a phase encoding pulse in an FSE sequence. Thus, a phase shift in subsequent echo due to the influence of eddy currents and residual magnetization caused by the preceding phase encoding pulse or the like in the FSE sequence can be measured by matching with an actual FSE sequence.

Incidentally, the reset pulse does not influence phase encoding because it is also inserted before the inversion pulse.

In a third aspect, the present invention provides an MR imaging method according to the first aspect, wherein a compensating pulse for compensating for the amount of the phase shift measured by the phase shift measuring method according to the second aspect is built in each phase encoding pulse, added to one or both immediately before or after the phase encoding pulse, built in each rewind pulse, or added to one or both immediately before or after the rewind pulse.

In the MR imaging method according to the third aspect, since the compensation for the amount of the phase shift, which could be measured by matching with the actual FSE sequence, is performed, a phase shift in subsequent echo due to the influence of eddy currents and residual magnetization caused by each preceding phase encoding pulse or the like in an FSE pulse sequence can be corrected accurately.

In a fourth aspect, the present invention provides a phase shift measuring method comprising the steps of transmitting an excitation pulse, transmitting an inversion pulse, applying a read pulse to a read axis, continuously transmitting an inversion pulse, applying a dephaser pulse to a phase axis, collecting data from echoes while applying a read pulse to the phase axis, acquiring first phase data by converting the data into one-dimensional Fourier form, inserting a positive or negative reset pulse having amplitude equal to the maximum amplitude used in the phase axis or having greater amplitude into the phase axis before and behind the inversion pulse, acquiring second phase data similarly except for the inserting step, and determining the amount of a phase shift due to the influence of the reset pulse, based on the difference between the first phase data and the second phase data.

As described in the first to third aspects, the residual magnetization prior to the application of the phase encoding pulse can be always kept constant by using the reset pulse. However, the influence produced due to the insertion of the reset pulse must also be taken into consideration (eddy currents are considered as a typical one of the influence).

In the phase shift measuring method according to the fourth aspect, the amount of the phase shift due to the influence of the reset pulse can be determined from the difference between the phase data at the non-insertion of the reset pule and the phase data at the insertion of the reset pulse.

In a fifth aspect, the present invention provides an MR imaging method according to the third aspect, wherein the area of the reset pulse or compensating pulse is changed so as to compensate for the amount of the phase shift measured by the phase shift measuring method according to the fourth aspect.

In the MR imaging method according to the fifth aspect, an FSE sequence, which has corrected the phase shift due to the influence of the reset pulse, can be executed.

In a sixth aspect, the present invention provides an MR imaging system comprising RF pulse transmitting means, gradient pulse applying means, NMR signal receiving means, the MR imaging system executing MR imaging by a high-speed spin echo process for controlling the respective means to thereby transmit an inversion pulse after the transmission of an excitation pulse, apply a phase encoding pulse to a phase axis, collect data from echoes while a read pulse is being applied to a read axis, repeat the application of a rewind pulse to the phase axis plural times while changing the phase encoding pulse and collect data from a plurality of echoes by one excitation, and reset pulse applying means for inserting a positive or negative reset pulse having amplitude equal to the maximum amplitude used in an arbitrary gradient axis or having greater amplitude into the arbitrary gradient axis before and behind the inversion pulse.

The MR imaging system according to the sixth aspect is capable of suitably executing the MR imaging method according to the first aspect.

According to the MR imaging method of the present invention as described above, the influence of the variation in residual magnetization, which is caused by the change in gradient magnetic field pulse, can be prevented.

According to the phase shift measuring method of the present invention as well, the phase shift in subsequent echo due to the influence of the eddy currents and residual magnetization caused by the preceding phase encoding pulse or the like in the FSE sequence can be measured by matching with the actual FSE sequence.

Further, according to the MR imaging system of the present invention, the above-described method can suitably be implemented.

Further objects and advantages of the present invention will be apparent form the following description of the preferred embodiments of the invention as illustrated in the accompanying drawings.

DETAILED DESCRIPTION OF THE INVENTION

Figure 1:
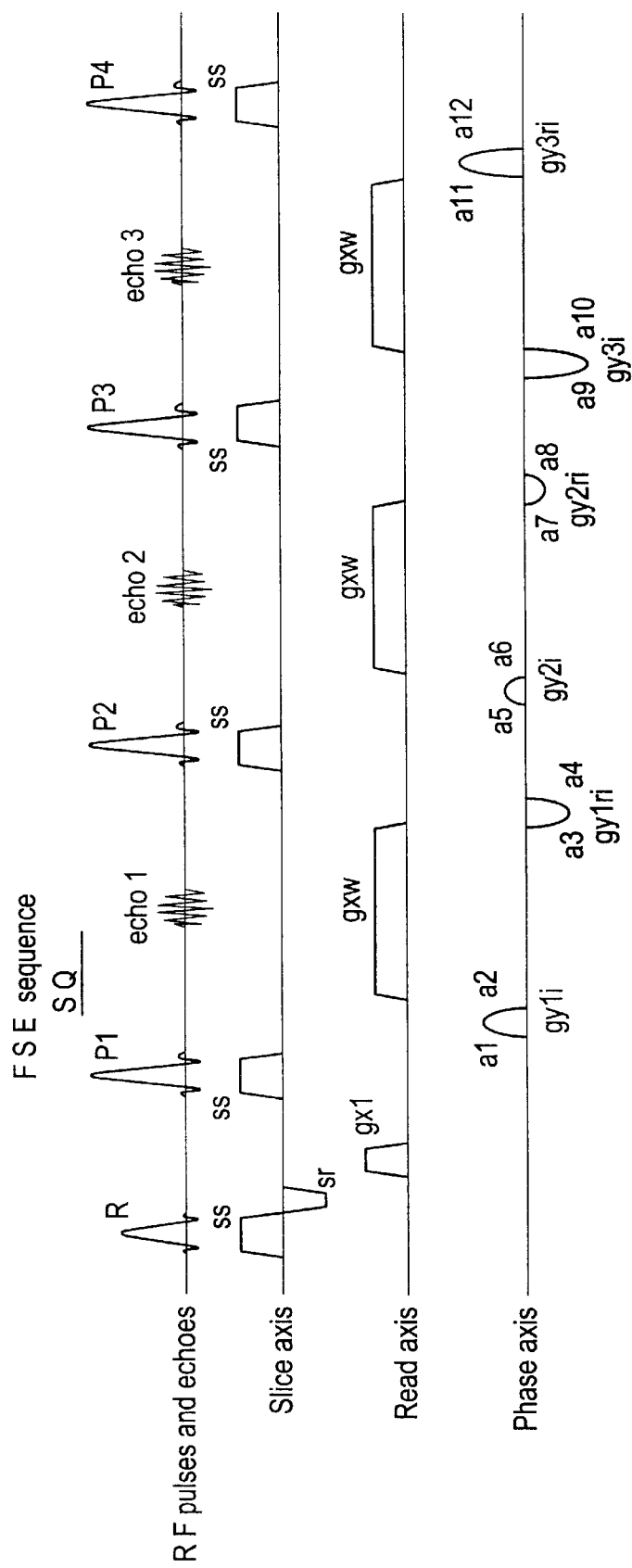
FIG. 1 is a pulse sequence diagram showing one example of a conventional FSE sequence.
Figure 2:
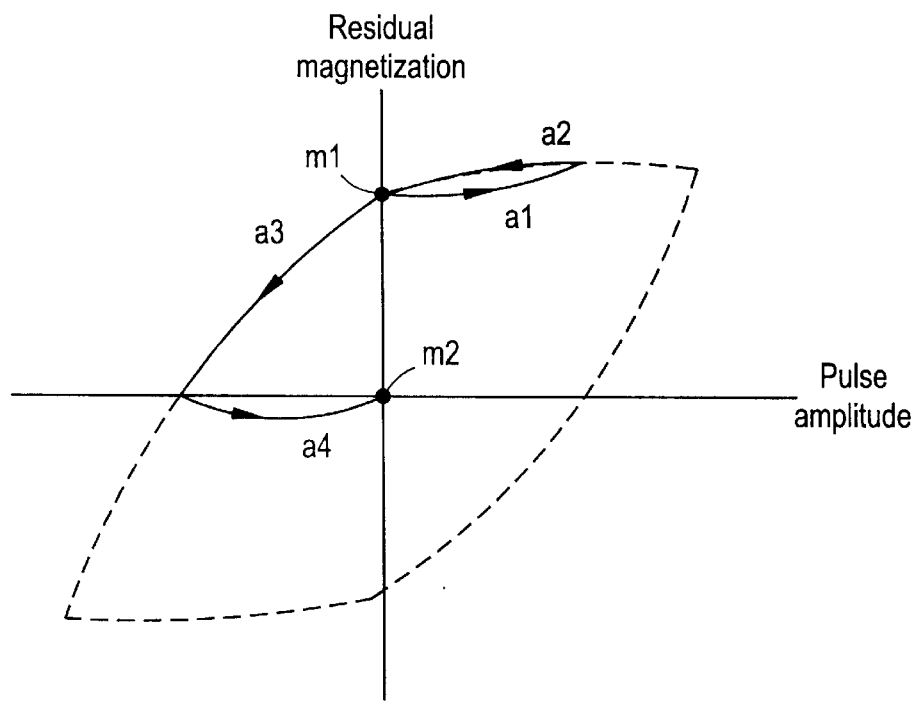
FIG. 2 is an explanatory diagram illustrating variations in residual magnetization by a first phase encoding pulse and a rewind pulse in the FSE sequence shown in FIG. 1.
Figure 3:
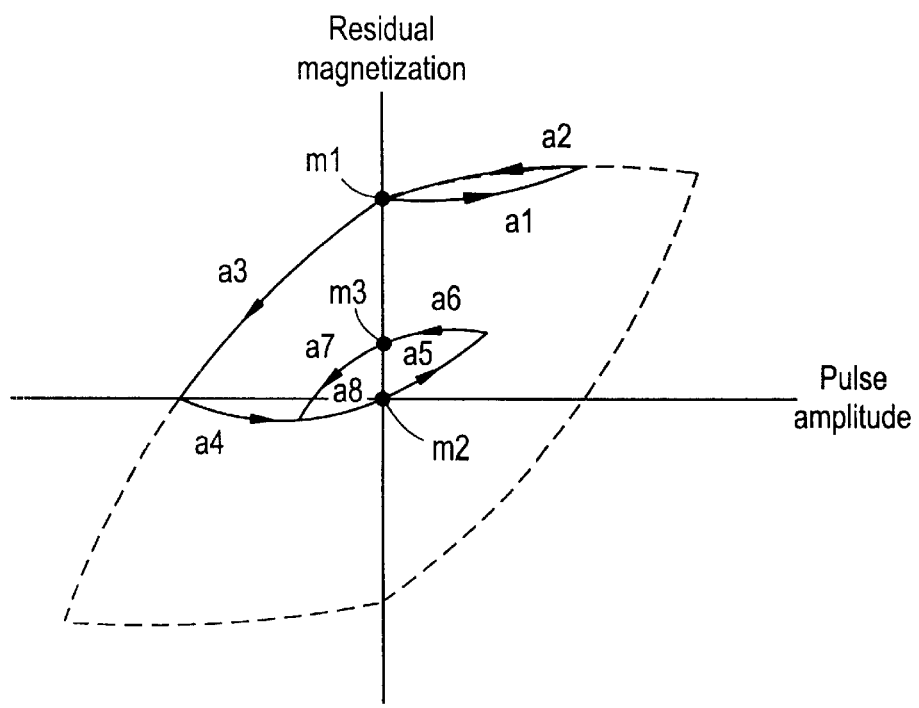
FIG. 3 is an explanatory diagram depicting variations in residual magnetization by a second phase encoding pulse and a rewind pulse in the FSE sequence shown in FIG. 1.

The present invention will hereinafter be described in further details by embodiments illustrated in the drawing.

Figure 4:
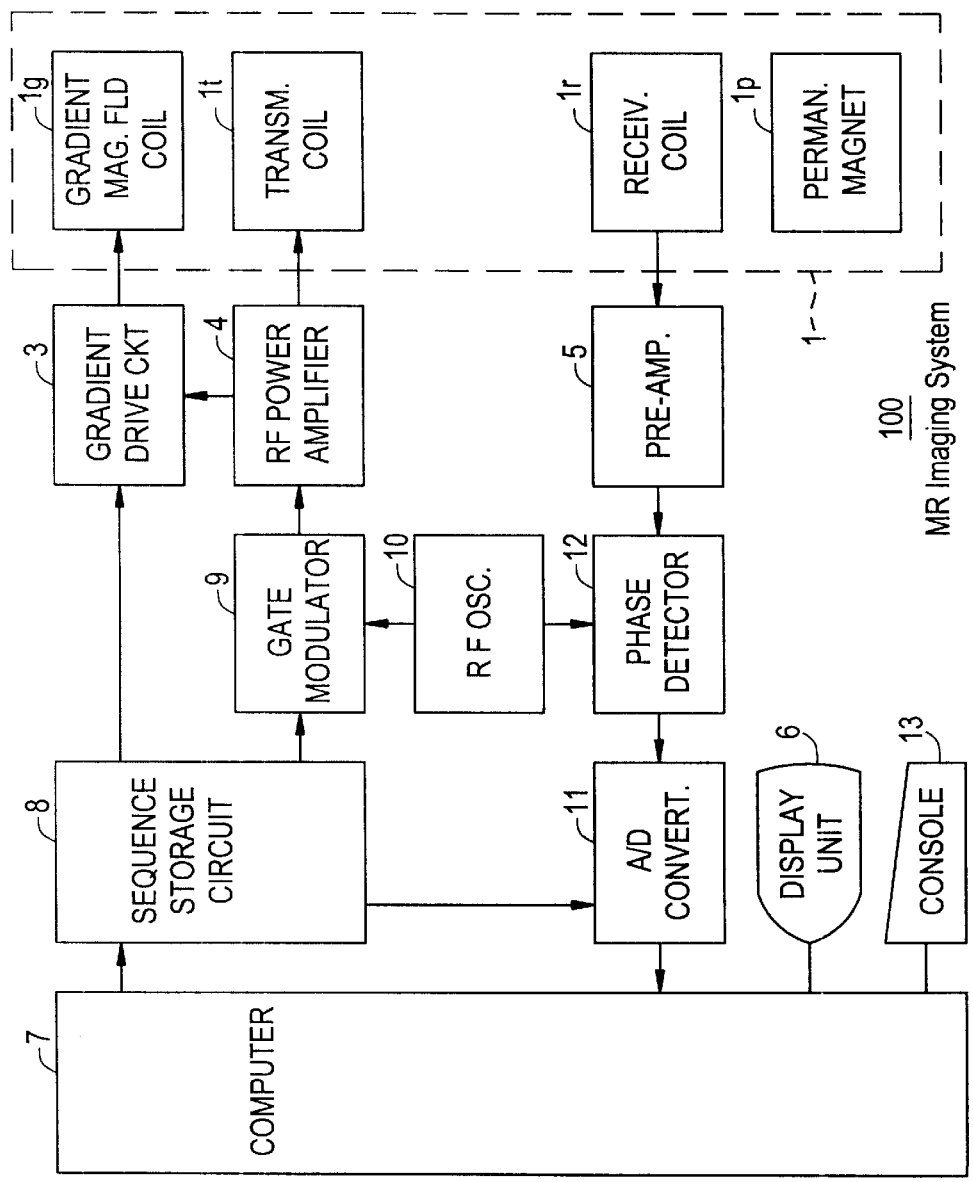
FIG. 4 is a block diagram showing an MR imaging system according to one embodiment of the present invention.

FIG. 4 is a block diagram showing an MR imaging system according to one embodiment of the present invention.

In the MR imaging system 100, a magnet assembly 1 has a space (hole) for inserting a sample thereinside and is provided with a permanent magnet 1p for applying a constant magnetic field to the sample, a gradient or gradient magnetic field coil 1g for generating gradient or gradient magnetic fields for a slice axis, a phase axis and a read axis, a transmitting coil 1t for supplying a RF pulse for exciting the spin of a nucleus in the sample, and a receiving coil 1r for detecting an NMR signal form the sample, so as to surround the space. The gradient magnetic field coil 1g, transmitting coil 1t and receiving coil 1r are respectively electrically connected to a gradient or gradient magnetic field driving circuit 3, a RF power amplifier 4 and a pre-amplifier 5.

A sequence storage circuit 8 controls or operates the gradient magnetic field driving circuit 3, based on a pulse sequence stored therein in accordance with instructions given from a computer 7 to thereby generate a magnetic field from the gradient magnetic field coil 1g of the magnet assembly 1. Further, the sequence storage circuit 8 operates a gate modulator 9 to modulate a carrier output signal produced from a RF oscillator 10 to a pulsated signal represented in the form of a predetermined timing and predetermined envelope and add it to the RF power amplifier 4 as a RF pulse, where it is power-amplified. Thereafter, the RF power amplifier 4 applies the pulse to the transmitting coil 1t of the magnet assembly 1 to select and excite a desired slice region.

The pre-amplifier 5 amplifies an NMR signal from the sample, which is detected by the receiving coil 1r of the magnet assembly 1, and inputs the amplified NMR signal to a phase detector 12. The phase detector 12 receives a carrier output signal produced from the RF oscillator 10 as a reference signal, phase-detects the NMR signal supplied from the pre-amplifier 5 and supplies it to an A/D converter 11. The A/D converter 11 converts the phase-detected analog signal to a digital signal and inputs it to the computer 7.

The computer 7 reads data from the A/D converter 11 and performs an image reconstructing computation on the data to thereby generate an image for a desired slice region. The image is displayed on a display unit 6. Further, the computer 7 serves the entire control such as the reception of information inputted through a console 13.

Figure 5:
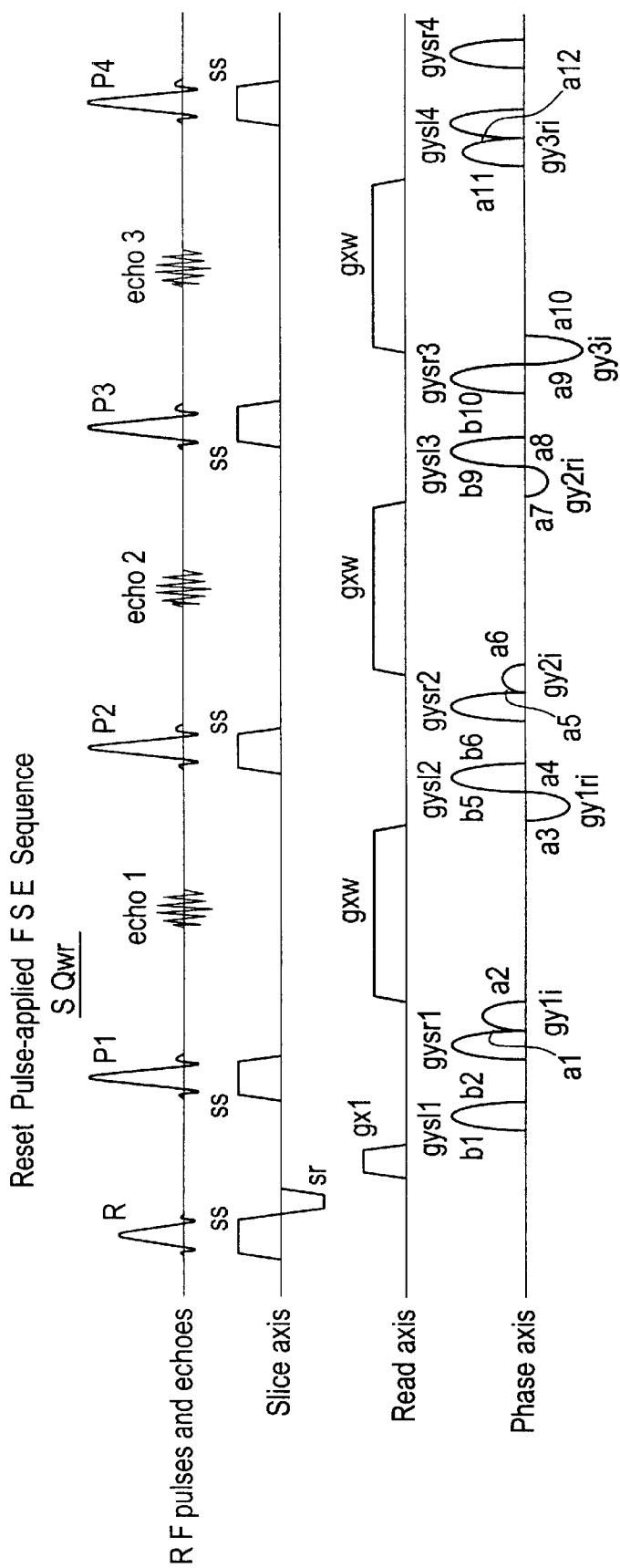
FIG. 5 is a pulse sequence diagram illustrating a reset pulse-applied FSE sequence according to one embodiment of the present invention.

FIG. 5 is a pulse sequence diagram of a high-speed spin echo method according to the present invention.

In the reset pulse-applied FSE sequence SQwr, an excitation pulse R and a slice gradient ss are first applied. While a first inversion pulse P1 and a slice gradient ss are next applied, positive reset pulses gys1l and gysr1 each equal to the maximum amplitude used in a phase axis are inserted into the phase axis before and behind the first inversion pulse P1. Next, a phase encoding pulse gy1i is applied to the phase axis. An NMR signal is then received from a first echo echo1 while a read pulse gxw is being applied. Thereafter, a rewind pulse gy1ri equal in time integrated value and opposite in polarity to the phase encoding pulse gy1i is applied to the phase axis. Incidentally, i indicates repeat numbers, i.e., i=1 to I (e.g., I=128).

Next, a second inversion pulse P2 and a slice gradient ss are applied. On the other hand, positive reset pulses gys12 and gysr2 equal to the maximum amplitude employed in the phase axis are inserted into the phase axis before and behind the second inversion pulse P2. Next, a phase encoding pulse gy2i is applied to the phase axis and an NMR signal is received from a second echo echo2 while the read pulse gxw is being applied. Thereafter, a rewind pulse gy2r equal in time integrated value and opposite in polarity to the phase encoding pulse gy2i is applied to the phase axis.

A jth inversion pulse Pj and a slice gradient ss are applied subsequently in the same manner as described above. At this time, reset pulses gy1i and gysri are inserted before and behind the jth inversion pulse Pj, and a phase encoding pulse gyji is applied to the phase axis. An NMR signal is received from a jth echo echoj while the read pulse gxw is being applied. Thereafter, the application of a rewind pulse gyjri identical in time integrated value and opposite in polarity to the phase encoding pulse gyji to the phase axis is repeated for j=3 to J (e.g., J=8).

Although not shown in the drawing, a dephaser pulse (grk) large in area is finally inserted to take the phases of nuclear spins on a random basis. The amplitude of the dephaser pulse is caused to coincide with that of each phase encoding pulse.

Incidentally, a compensating pulse (gypn) for compensating for the amount of a phase shift measured by a phase shift measuring method (see FIG. 9) using gradient or gradient magnetic field pulses, to be described later is built in phase encoding pulses gy1i through gyJI or/and rewind pulses gy1ri through gyJrI (the area is adjusted). The compensating pulse (gypn) may be added to one or both (area corresponding to one in total) immediately before or after the phase encoding pulses gy1i to gyJI or may be added to one or both (area corresponding to one in all) immediately before or after the rewind pulses gy1ri to gyJrI.

Further, one compensating pulse (gyps) for compensating for the amount of a phase shift measured by a reset pulse-based phase shift measuring method (see FIG. 11) to be described later is incorporated for each pair of reset pulses (gys1l/gysr1 through gys1J/gysrJ) (the area is adjusted). The compensating pulse (gyps) may be added to one or both (area corresponding to one in all) immediately before or after the pairs of reset pulses every pairs of the reset pulses (gys1l/gysr1 through gys1J/gysrJ).

Further, the reset pulses gys1l and gysr1 may be pulses having amplitude greater than the maximum amplitude employed in the phase axis. Alternatively, they may be negative pulses.

Figure 6:
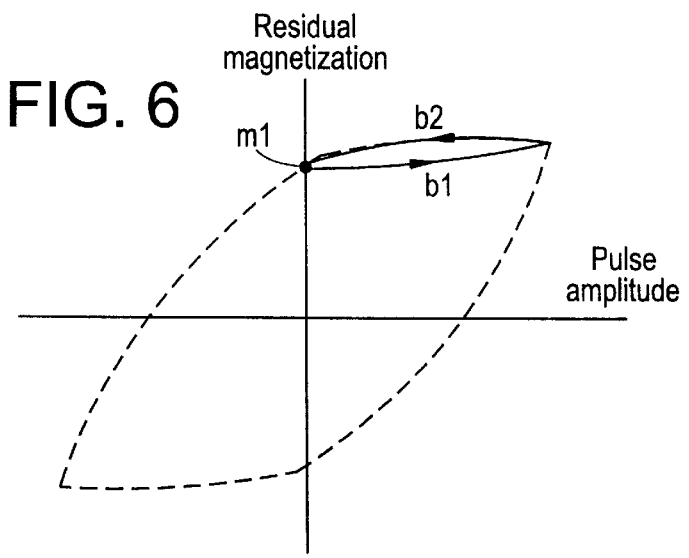
FIG. 6 is an explanatory diagram illustrating a variation in residual magnetization by a reset pulse in the reset pulse-applied FSE sequence shown in FIG. 5.

Assuming that the residual magnetization prior to the application of the reset pulse gys1l is defined as m1, residual magnetization traces histories b1 and b2 so as to return to m1 again by the application of the reset pulse gys1l, as shown in FIG. 6 due to a magnetic hysteresis characteristic of a magnetic shunt plate or the like of the permanent magnet 1p in the MR imaging system 100. Next, the residual magnetization traces the histories b1 and b2 so as to return to m1 again even when a reset pulse gysr1 is applied.

Figure 7:
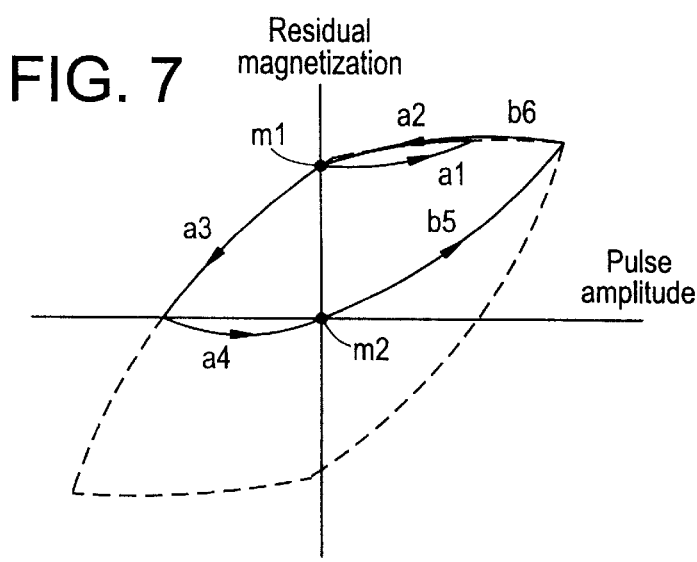
FIG. 7 is an explanatory diagram depicting variations in residual magnetization by a first phase encoding pulse and a rewind pulse in the reset pulse-applied FSE sequence shown in FIG. 5.

Since the residual magnetization preceding the application of a phase encoding pulse gy1l (i=1) is m1, the residual magnetization traces histories a1 and a2 so as to reach m1 again by the application of the phase encoding pulse gy1l, as shown in FIG. 7. Further, the residual magnetization traces histories a3 and a4 so as to reach m2 by the application of a rewind pulse gy1rl. Next, a reset pulse gys12 is applied, so that the residual magnetization traces histories b5 and b6 so as to return to m1 again. When a reset pulse gysr2 is next applied, the residual magnetization traces the histories b1 and b2 shown in FIG. 6 so as to return to m1 again.

Figure 8:
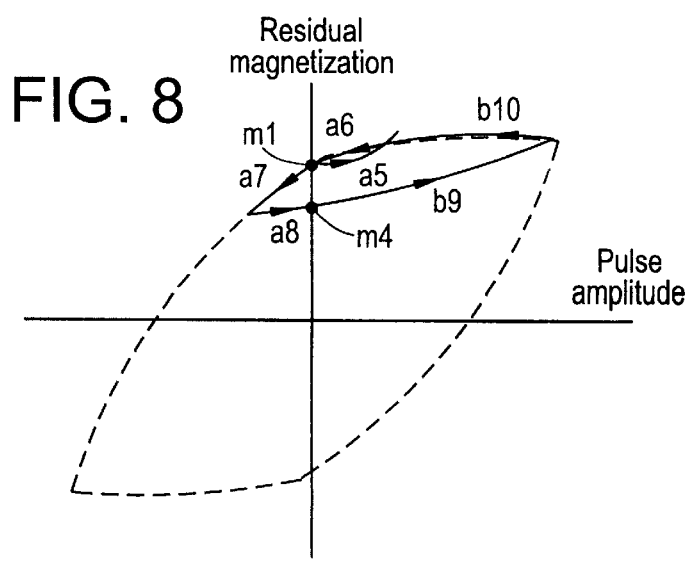
FIG. 8 is an explanatory diagram showing variations in residual magnetization by a second phase encoding pulse and a rewind pulse in the reset pulse-applied FSE sequence shown in FIG. 5.

Further, since the residual magnetization preceding the application of a phase encoding pulse gy21 results in m1 as shown in FIG. 8, the residual magnetization traces a5 and a6 so as to reach m1 by the application of the phase encoding pulse gy21. Further, when a rewind pulse gy2r1 is applied, the residual magnetization traces a7 and a8 so as to reach m4. A reset pulse gys13 is next applied, so that the residual magnetization traces b9 and b10 so as to return to m1 again. Next, when a reset pulse gysr3 is applied, the residual magnetization traces the histories b1 and b2 shown in FIG. 6 so as to return to m1 again.

In the MR imaging system 100 in this way, even if the gradient magnetic field pulses like the phase encoding pulses and rewind pulses are varied, the residual magnetization lying immediately before the application of each phase encoding pulse is always kept constant without depending on the histories thereof.

Figure 9:
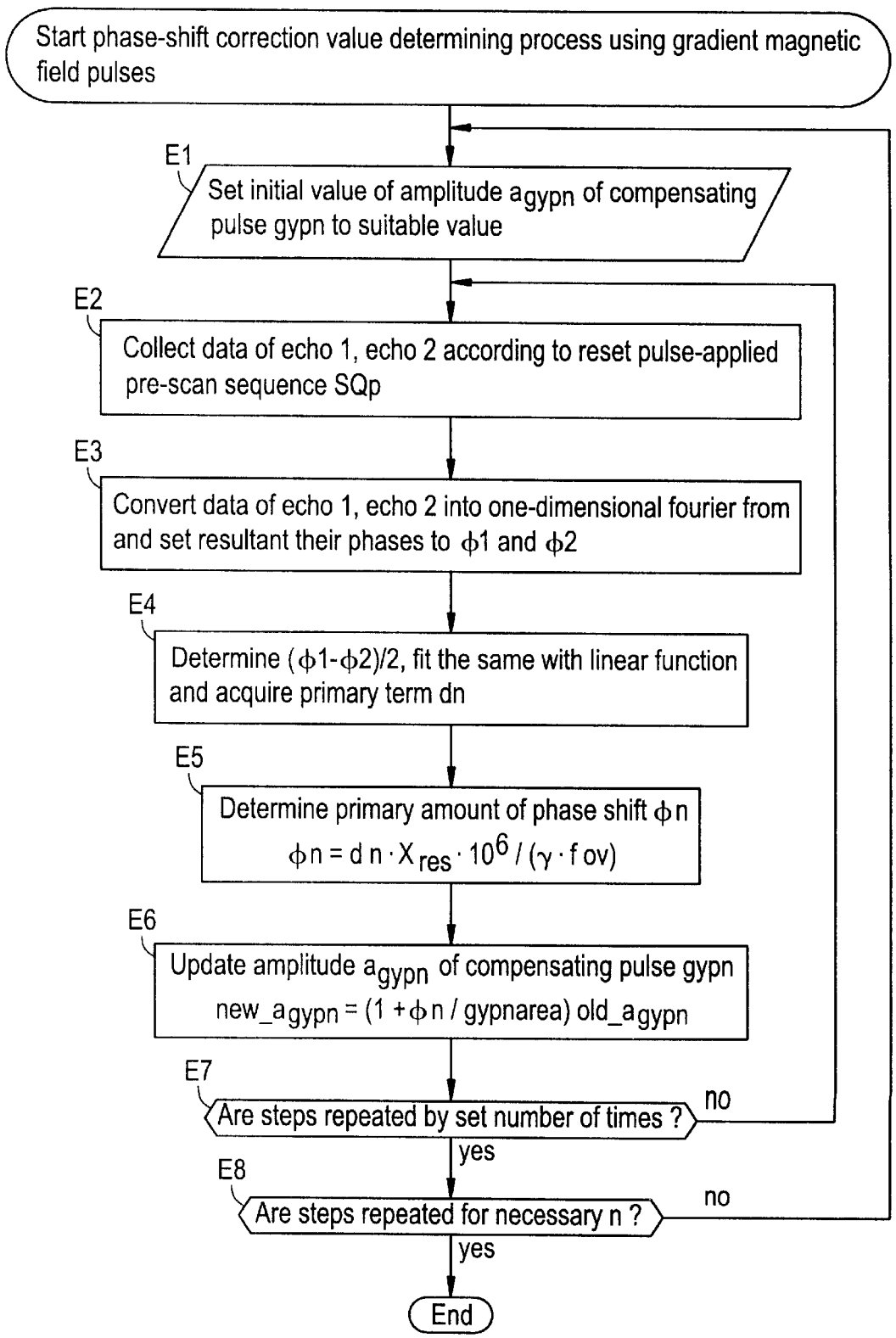
FIG. 9 is a flowchart for describing a phase-shift correction value determining process based on gradient magnetic field pulses.

FIG. 9 is a flowchart showing a phase-shift correction value determining process based on gradient magnetic field pulses, according to the present invention.

In Step E1, the initial value of an amplitude $a_{gypn}$ of a compensating pulse gypn is set to a suitable value. Here, n indicates the number of each phase encoding pulse at which one desires to measure the amount of a phase shift (determine a correction value).

Figure 10:
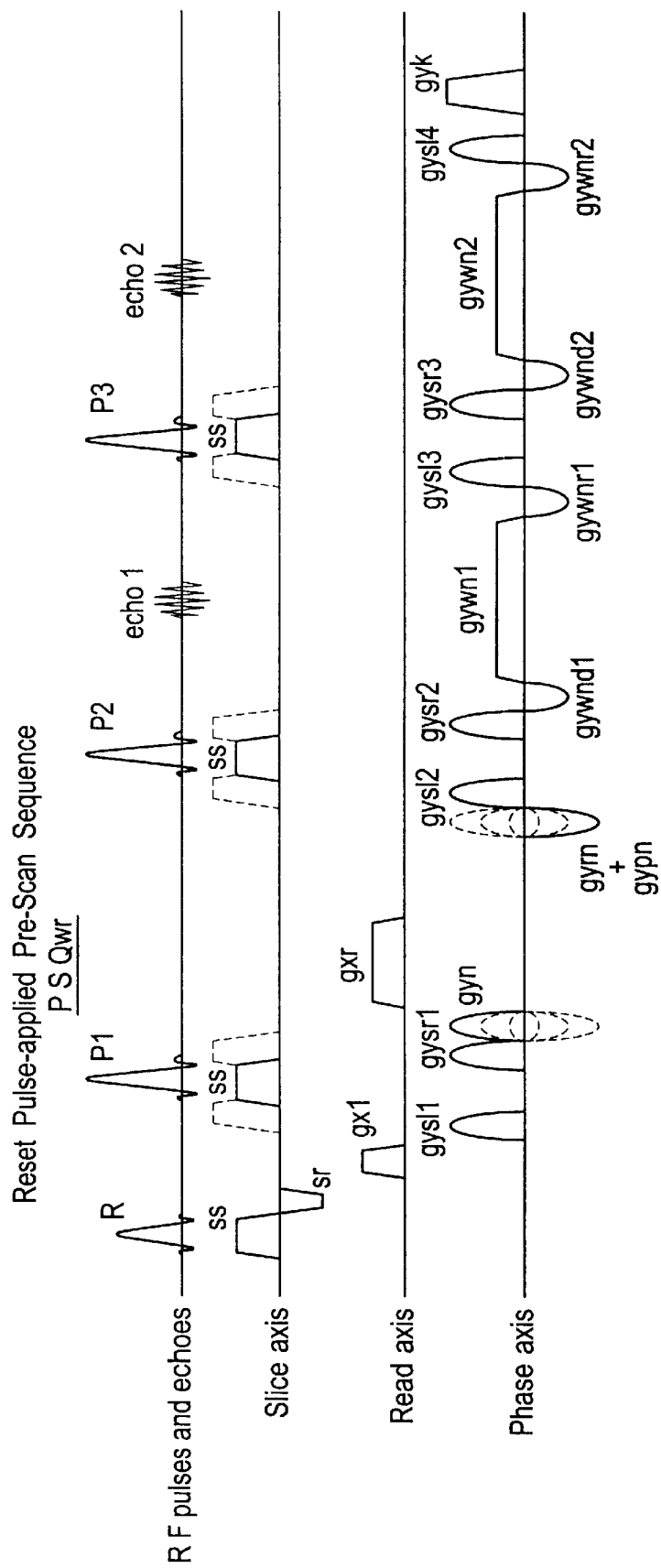
FIG. 10 is a pulse sequence diagram illustrating a reset pulse-applied pre-scan sequence.

In Step E2, data are collected from echoes echo1 and echo2 in accordance with a pulse sequence show in FIG. 10.

FIG. 10 is a pre-scan pulse sequence diagram according to the present invention.

In the reset pulse-applied pre-scan sequence PSQwr, an excitation pulse R and a slice gradient ss are first applied. While a first inversion pulse P1 and a slice gradient ss are next applied, positive reset pulses gys1l and gysr1 each equal to the maximum amplitude used in a phase axis are inserted into the phase axis before and behind the first inversion pulse P1. The reset pulses gys1l and gysr1 are identical to the reset pulses gys1l and gysr1 in the reset pulse-applied FSE sequence SQwr shown in FIG. 5. Incidentally, while large pulses (broken lines) for removing FID (Free Induction Decay) are normally inserted into both sides of the slice gradient ss, their roles are referred to the reset pulses gys1l and gysr1 and hence they are omitted. This is important in that the limitations on hard of the system are not made strict.

Next, a phase encoding pulse gyn at which one desires to measure the amount of a phase shift (determine a correction value), is applied to the phase axis. A read pulse gxr corresponding to the first half of a normal read pulse gxw is then applied. Thereafter, each read pulse is set to "0". Next, a pulse obtained by incorporating a compensating pulse gypn (to be described later) in a rewind pulse gyrn equal in time integrated value and opposite in polarity to the phase encoding pulse gyn is applied to the phase axis.

While a second inversion pulse P2 and a slice gradient ss are next applied, positive reset pulses gys12 and gysr2 equal to the maximum amplitude used in the phase axis are inserted into the phase axis before and behind the second inversion pulse P2.

Next, a dephaser pulse gywdn1 equal to the rewind pulse gyrn is applied to the phase axis. Then an NMR signal is received from an echo echo1 while a read pulse gywn1 is being applied to the phase axis. Thereafter, a rephaser pulse gywrn1 equal to the dephaser pulse gywdn1 is applied to the phase axis.

While a third inversion pulse P3 and a slice gradient ss are next applied, positive reset pulses gys13 and gysr3 each equal to the maximum amplitude used in the phase axis are inserted into the phase axis before and behind the third inversion pulse P3.

Next, a dephaser pulse gywdn2 equal to the rewind pulse gyrn is applied to the phase axis. The an NMR signal is received from an echo echo2 while a read pulse gywn2 is being applied to the phase axis. Thereafter, a rephaser pulse gywrn2 equal to the dephaser pulse gywdn2 is applied to the phase axis.

A dephaser pulse grk large in area is finally inserted to take the phases of nuclear spins on a random basis. The amplitude of the dephaser pulse is caused to coincide with the maximum amplitude of each phase encoding pulse.

The pre-scan sequence shown in FIG. 10 is basically one in which reset pulses are added to a pre-scan sequence shown in FIG. 32, which is described in Japanese Patent Application Laid-Open No. Hei 10-75940. However, this takes a structure which offers more resistance to the residual magnetization.

Referring back to FIG. 9, in Step E3, the data obtained from the echoes echo1 and echo2 are converted into one-dimensional Fourier form, and the resultant phases are defined as $\phi1$ and $\phi2$ respectively.

In Step E4, $(\phi1-\phi2)/2$ is determined and the result of determination is fitted with a linear function using a least square method or the like. Further, a primary term dn of the result thereof is obtained.

In Step E5, a primary amount $\phi n$ of a phase shift is determined from the following equation:

$$\phi n = dn \cdot X_{res} \cdot 106/(\gamma \cdot fov)$$

where $X_{res}$ indicates a sampling point number of an echo. Further, $\gamma$ indicates a magnetic rotating ratio. Fov indicates the size (cm) of an imaging field of view.

In Step E6, the amplitude $a_{gypn}$ of a compensating pulse gypn is updated.

$$new\_a_{gypn} = (1+\phi n/gypnarea) old\_a_{gypn}$$

where $new\_a_{gypn}$ indicates the post-updating amplitude, $old\_a_{gypn}$ indicates the pre-updating amplitude, and gypnarea indicates the area (equivalent to the amount of dephase) of the pre-updating compensating pulse gypn.

In Step E7, Steps E2 through E6 referred to above are repeated by the set number of times. Thereafter, the above process proceeds to Step E8.

In Step E8, Steps E1 through E7 referred to above are repeatedly performed on the necessary n. Thereafter, the process is terminated.

Thus, the amount $(\phi n)$ of the phase shift for the phase encoding pulse (gyn) can be measured and the correction value (corresponding to the amplitude $a_{gypn}$ of the compensating pulse gypn) can be determined.

Figure 11:
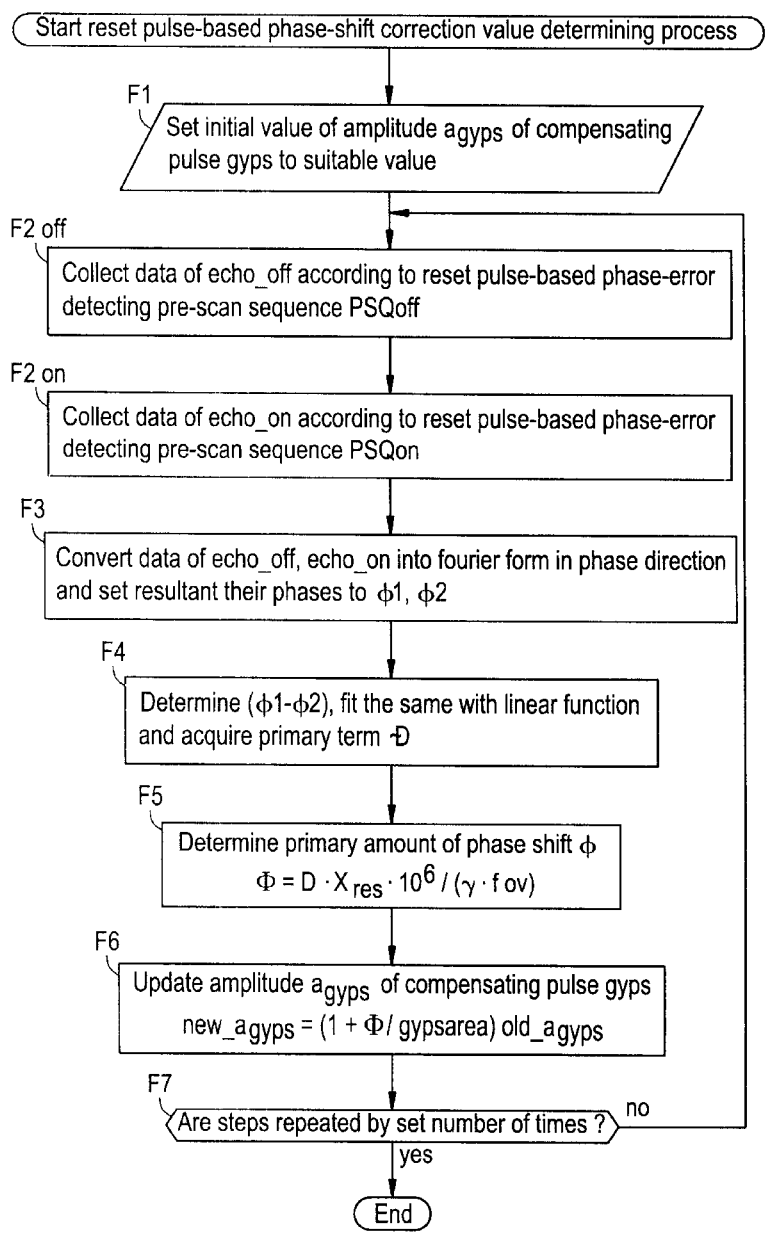
FIG. 11 is a flowchart for describing a phase-shift correction value determining process based on a reset pulse.

FIG. 11 is a flowchart showing a reset pulse-based phase-shift correction value determining process according to the present invention.

In Step F1, the initial value of an amplitude $a_{gyps}$ of a compensating pulse gyps is set to a suitable value.

Figure 12:
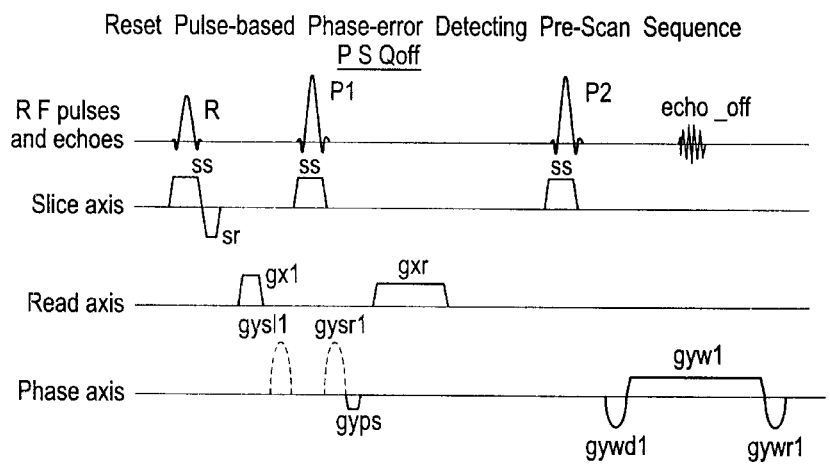
FIG. 12 is a pulse sequence diagram depicting a phase-error detecting pre-scan sequence (preset pulse: OFF) based on a reset pulse.

In Step F2off, data are collected from an echo echo_off in accordance with a pulse sequence shown in FIG. 12.

FIG. 12 is a pulse sequence diagram showing a reset pulse-based phase-error detecting pre-scan sequence according to the present invention.

In the reset pulse-based phase-error detecting pre-scan sequence PSQoff, an excitation pulse R and a slice gradient ss are first applied. Next, a first inversion pulse P1 and a slice gradient ss are applied. No reset pulses are applied. Next, a compensating pulse gyps is applied to a phase axis. A read pulse gxr corresponding to the first half of a normal read pulse gxw is next applied. Thereafter, each read pulse is set to "0".

Next, a second inversion pulse P2 and a slice gradient ss are applied. Then a dephaser pulse gywd1 is applied to the phase axis. Next, an NMR signal is received from an echo echo_on while a read pulse syw1 is being applied to the phase axis. Afterwards, a rephaser pulse gywr1 equal to the dephaser pulse gywd1 is applied to the phase axis.

Figure 13:
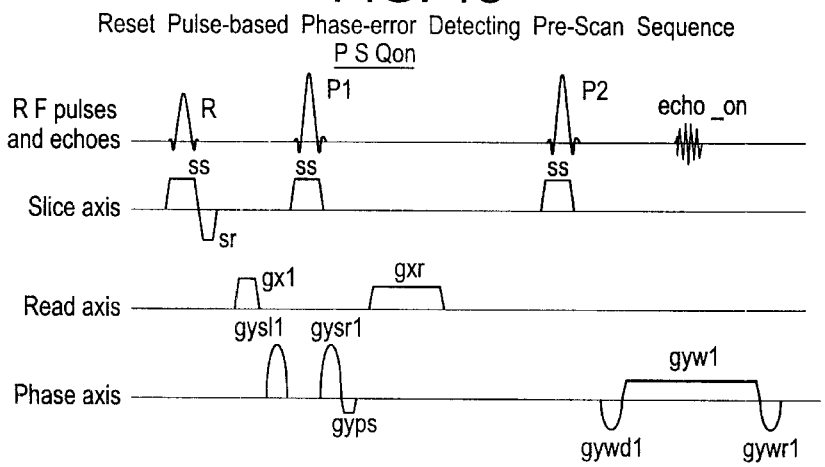
FIG. 13 is a pulse sequence diagram showing a phase-error detecting pre-scan sequence (preset pulse: ON) based on a reset pulse.

Referring back to FIG. 11, data are collected from an echo echo_on in accordance with a pulse sequence shown in FIG. 13 in Step F2on.

FIG. 13 is a pulse sequence diagram showing a reset pulse-based phase-error detecting pre-scan sequence according to the present invention.

In the reset pulse-based phase-error detecting pre-scan sequence PSQon, an excitation pulse R and a slice gradient ss are first applied. While a first inversion pulse P1 and a slice gradient ss are next applied, reset pulses gys11 and gysr1 are inserted into a phase axis before and behind the first inversion pulse P1. The reset pulses gys11 and gysr1 are respectively pulses identical to the reset pulses gys11 and gysr1 in the reset pulse-applied FSE sequence SQwr shown in FIG. 5. Next, a compensating pulse gyps is applied to the phase axis. Then a read pulse gxr corresponding to the first half of a normal read pulse gxw is applied. Afterwards, each read pulse is set to "0".

Next, a second inversion pulse P2 and a slice gradient ss are applied. Then an NMR signal is received from an echo echo_on while a read pulse gyw1 is being applied to the phase axis. Afterwards, a rephaser pulse gywr1 equal to the dephaser pulse gywd1 is applied to the phase axis.

Referring back to FIG. 11, in Step F3, the data obtained from the echoes echo_off and echo_on are converted into one-dimensional Fourier form, and the resultant phases are defined as $\Phi1$ and $\Phi2$ respectively.

In Step F4, $(\Phi1-\Phi2)$ is determined and the result of determination is fitted with a linear function using a least square method or the like. Further, a primary term D of the result thereof is obtained.

In Step F5, a primary amount $\Phi$ of a phase shift is determined from the following equation:

$$\Phi = D \cdot X_{res} \cdot 106/(\gamma \cdot fov)$$

where $X_{res}$ indicates a sampling point number of an echo. Further, $\gamma$ indicates a magnetic rotating ratio. fov indicates the size (cm) of an imaging field of view.

In Step F6, the amplitude $a_{gyps}$ of a compensating pulse gyps is updated.

$$new\_a_{gyps} = (1+\phi/gypsarea) old\_a_{gyps}$$

where $new\_a_{gyps}$ indicates the post-updating amplitude, $old\_a_{gyps}$ indicates the pre-updating amplitude, and gypsarea indicates the area of the pre-updating compensating pulse gyps.

In Step F7, Steps F2off through F6 referred to above are repeated by the set number of times. Thereafter, the above process is finished.

Thus, a phase error ($\Phi$) for each reset pulse can be measured and a correction value (corresponding to the amplitude $a_{gyps}$ of the compensating pulse gyps) can be determined.

Many widely different embodiments of the invention may be constructed without departing from the spirit and the scope of the present invention. It should be understood that the present invention is not limited to the specific embodiments described in the specification, except as defined in the appended claims.

What is claimed is:

1. An magnetic resonance imaging method using a high speed spin echo process, said method comprising the steps of:

transmitting an excitation pulse;

transmitting an inversion pulse after transmission of said excitation pulse;

applying a phase encoding pulse to a phase axis;

collecting data from echoes while applying a read pulse to a read axis;

applying a rewind pulse to said phase axis a plurality of times while changing said phase encoding pulse;

collecting data from a plurality of echoes caused by one excitation; and inserting a positive or negative reset pulse to said phase axis, said reset pulse having an amplitude equal to a maximum or greater amplitude than used in said phase axis before and behind said inversion pulse so as to prevent variations in residual magnetization due to change of gradient magnetic field pulse.

2. The method of claim 1, further comprising the step of providing a compensation pulse for amount of phase shift measured by a first phase shift measuring method comprising the steps of:

transmitting an excitation pusle;

transmitting an inversion pulse;

applying a phase encoding pusle to a phase axis;

applying a read pulse to a read axis;

applying a rewind pulse to said phase axis;

continuously transmitting an inversion pulse;

applying a dephaser pusle to said phase axis;

collecting data from echoes while applying a read pulse to said phase axis; and determining amount of phase shift due to influence of said phase encoding pulse, based on phase data obtained by converting data into a one-dimensional Fourier form.

3. The method of claim 2, wherein an area of said reset pulse or said compensation pulse is changed so as to compensate for amount of phase shift measured by a second phase shift measuring method comprising-the steps of:

transmitting an excitation pulse;

transmitting an inversion pulse;

applying a read pulse to a read axis;

continuously transmitting an inversion pulse;

applying a dephaser pulse to a phase axis;

collecting data from echoes while applying a read pulse to said phase axis;

acquiring first phase data by converting data into a one-dimensional Fourier form;

acquiring a second phase data by converting data into a one-dimensionaly Fourier form; and determining amount of phase shift due to influence of said reset pulse, based on difference between said first phase data and second phase data.

4. A phase shift measuring method, comprising the steps of:

transmitting an excitation pulse;

transmitting an inversion pulse;

applying a phase encoding pulse to a phase axis;

applying a read pulse to a read axis;

applying a rewind pulse to said phase axis;

continuoulsy transmitting an inversion pulse;

applying a dephaser pulse to said phase axis;

collecting data from echoes while applying a read pulse to said phase axis;

determining amount of phase shift due to influence of said phase encoding pulse, based on phase data obtained by converting said collected data into a one-dimensional Fourier form; and inserting a positive or negative reset pulse into a phase axis having an amplitude equal to a maximum or greater amplitude than used in said phase axis before and behind said inversion pulse so as to prevent variations in residue magnetization due to changes of gradient magnetic field pulse.

5. A phase shift measuring method, comprising the steps of:

transmitting an excitation pulse;

transmitting an inversion pulse;

applying a read pulse to a read axis;

continuously transmitting an inversion pulse;

applying a dephaser pulse to a phase axis;

collecting data from echoes while applying a read pulse to said phase axis;

acquiring first phase data by converting collected data into a one-dimensional Fourier form;

inserting a positive or negative reset pulse into a phase axis having an amplitude equal to a maximum or greater amplitude than used in said phase axis before and behind said inversion pulse so as to prevent variations in residue magnetization due to changes of gradient magnetic field pulse;

acquiring second phase data similarly, except for said inserting step; and determining amount of phase shift due to influence of said reset pulse, based on difference between said first phase data and second phase data.

6. A magnetic resonance imaging system, comprising:

RF pulse transmitting means;

gradient pulse applying means;

NMR signal receiving means;

said system executing magnetic resonance imaging by use of a high speed spin echo technique for controlling said respective means to perform the following steps:

transmit an inversion pulse after transmission of an excitation pulse;

apply a phase encoding pulse to a phase axis;

collect data from echoes while a read pulse is being applied to a read axis;

repeatedly apply a rewind pulse to said phase axis a plurality of times while changing said phase encoding pulse; and collect data from a plurality of echoes caused by one excitation; and reset means for inserting a positive or negative reset pulse into a phase axis having an amplitude equal to a maximum or greater amplitude than used in said phase axis before and behind said inversion pulse so as to prevent variations in residue magnetization due to changes of gradient magnetic field pulse.

7. The system of claim 6, further comprising:

phase shift correcting means for controlling said RF pulse transmitting means, said gradient pulse applying means and said NMR signal receiving means, so that the following steps are performed:

transmit an excitation pulse;

transmit an inversion pulse;

apply a phase encoding pulse to a phase axis;

apply a read pulse to a read axis;

apply a rewind pulse to said phase axis;

continuously transmit an inversion pulse;

apply a dephase pulse to said phase axis;

collect data from echoes while applying a read pulse to said phase axis;

determine amount of phase shift due to influence of said phase encoding pulse, based on phase data obtained by converting data into a one-dimensional Fourier form;

provide a compensation pulse for compensating for amount of phase shift in each phase encoding pulse in a phase sequence according to said high speed spin echo technique;

add the same to one or both immediately before or after said phase encoding pulse; and incorporate same in each rewind pulse or add same to one or both immediately before or after said rewind pulse.

8. The system of claim 7, wherein said RF pulse transmitting means, said gradient pulse applying means and said NMR signal receiving means are controlled to perform the following steps:

transmit an excitation pulse;

transmit an inversion pulse;

apply a read pulse to a read axis;

continuously transmit an inversion pulse;

apply a dephaser pulse to a phase axis;

collect data from echoes while applying a read pulse to said phase axis;

convert data into a one-dimensional Fourier form to acquire a first phase data;

convert data into a one-dimensional Fourier form to acquire a second phase data without using any reset pulse;

determine amount of phase shift due to influence of said reset pulse, based on difference between said first phase data and said second phase data; and change area of said rest pulse insert into said pulse sequence according to said high speed spin echo technique or a compensation pulse added so as to compensate for said amount of phase shift.

* * * * *